United States Patent [19]
Tsumura

[11] Patent Number: 5,831,477
[45] Date of Patent: Nov. 3, 1998

[54] POWER AMPLIFIER SYSTEM WITH VARIABLE OUTPUT

[75] Inventor: Soichi Tsumura, Tokyo, Japan

[73] Assignee: NEC Corporation, Tokyo, Japan

[21] Appl. No.: 746,219

[22] Filed: Nov. 7, 1996

[30] Foreign Application Priority Data

Nov. 7, 1995  [JP]  Japan ..................................... 7-288497

[51] Int. Cl.⁶ .................................................. H03G 3/00
[52] U.S. Cl. .......................... 330/51; 330/151; 330/133; 330/279; 330/297; 455/127
[58] Field of Search ............................. 330/51, 151, 129, 330/133, 202, 278, 279, 297; 455/93, 116, 127

[56] References Cited

U.S. PATENT DOCUMENTS

| | | | |
|---|---|---|---|
| 4,598,252 | 7/1986 | Andricos ..................................... | 330/51 |
| 5,661,434 | 8/1997 | Brozovich et al. ........................ | 330/51 |

FOREIGN PATENT DOCUMENTS

| | | |
|---|---|---|
| 4-156707 | 5/1992 | Japan . |
| 5-83041 | 4/1993 | Japan . |
| 5-343929 | 12/1993 | Japan . |

*Primary Examiner*—James B. Mullins
*Attorney, Agent, or Firm*—Ostrolenk, Faber, Gerb & Soffen, LLP

[57] ABSTRACT

A power amplifier system which makes it possible to reduce the power consumption at a low power output and to stably change the output power within a wide range. This power amplifier system includes a first power amplifier unit having a fixed gain, and a second power amplifier unit having a fixed gain, both of which are connected in cascade. The first amplifier unit receives and amplifies an initial input signal and outputs a first output signal. The second amplifier unit receives and amplifies the first output signal and outputs a second output signal. A supply voltage controller serves to control the supply or stop of a power supply voltage to the first and second amplifier units in response to a control signal. The output selector serves to select one of the first and second output signals and to output the selected signal as an output signal of the power amplifier system in response to the control signal. For low power level, only the first amplifier unit is activated and the first output signal is outputted as the output signal of the system. For higher power level, the first and second amplifier units are activated and the second output signal is outputted as the output signal of the system.

20 Claims, 7 Drawing Sheets

POWER AMPLIFIER SYSTEM WITH VARIABLE OUTPUT

BACKGROUND OF THE INVENTION

1. Field of the Invention

The present invention relates to a power amplifier system and more particularly, to a power amplifier system having a variable output, which is preferably applied to mobile communication systems where power consumption is strictly restricted.

2. Description of the Prior Art

In recent digital mobile communication systems, to increase the number of applicable users within a limited, narrow frequency range, various linear modulation methods such as Quadrature Phase Shift Keying (QPSK) and ($\pi$/4)-shifted QPSK which provide the high-level frequency efficiency have been popularly employed.

To maintain the high-level frequency efficiency for a linear-modulated signal, transmitters of radio base stations and/or mobile stations typically include class-A power amplifiers whose input/output characteristic is linear or class-AB power amplifiers whose input/output characteristic is approximately linear.

For the Code Division Multiple Access (CDMA) system where the same frequency range is simultaneously used in a plurality of mobile stations, such a problem that low-level signals transmitted from far mobile stations are interfered with high-level signals transmitted from near mobile stations tends to occur. This phenomenon causes the communication between the base stations and the far mobile stations to be difficult or impossible.

If the transmitting power of the mobile stations are designed to be variable within a wide range so that simultaneously received signals by receivers of the base stations are retained at approximately the same level, the above problem can be solved. However, another problem relating to power utilization efficiency occurs.

Specifically, for linear modulation, class-A or class-AB power amplifiers are typically used in the transmitters. These power amplifiers always require constant dc bias currents independent of the level of input signals. Therefore, even if the input signals are set at a low level to thereby decrease the transmitting power of the transmitters of the mobile stations, the same electric power is always dissipated due to the dc bias currents. This degrades the power utilization efficiency of the transmitters.

To solve this problem about the power utilization efficiency, a conventional power amplifier system shown in FIG. 1 was developed, which was disclosed in the Japanese Non-Examined Publication Nos. 4-156707 published in May 1992 and 5-83041 published in April 1993.

In FIG. 1, the conventional power amplifier system includes a variable-gain amplifier 1010, a fixed-gain, linear (class-A) power amplifier 1020, and a controller 1040 for controlling the two amplifiers 1010 and 1020 in response to a control signal 1170.

The controller 1040 generates and supplies a gain control signal 1140 to the variable-gain amplifier 1010 to control its gain. The controller 1040 further generates and supplies a bias control signal 1150 to the power amplifier 1020 to control its bias point.

An input signal 1100 is inputted into the variable-gain amplifier 1010 to be amplified, generating an output signal 1110. The amplified output signal 1110 is then inputted into the linear power amplifier 1020 to be linear-amplified, generating an output signal 1120. The output signal 1120 is outputted as an output signal of the conventional power amplifier system of FIG. 1.

On maximum output-power operation, the bias for the linear amplifier 1020 is controlled by the bias control signal 1150 so that the operating point is located at approximately the center of a load line of the amplifier 1020. On low output-power operation, the bias for the linear amplifier 1020 is controlled so that the dc component of the output signal 1120 is decreased.

Thus, the power utilization efficiency on the low output-power operation can be improved to a certain extent due to the decrease of the dc component of the output signal 1120.

To solve the above problem, another conventional power amplifier system shown in FIG. 2 was developed, which was disclosed in the Japanese Non-Examined Patent Publication No. 5-343929 published in December 1993.

In FIG. 2, the conventional power amplifier system includes a variable-gain amplifier 2010, a fixed-gain, linear (class-A) power amplifier 2020, an impedance matching unit 2030, and a controller 2040.

The controller 2040 serves to control the two amplifiers 2010 and 2020 and the unit 2030 in response to a control signal 2170. The controller 2040 generates and supplies a gain control signal 2140 to the variable-gain amplifier 2010 to control its gain. The controller 2040 further generates and supplies a bias control signal 2150 to the power amplifier 2020 to control its bias. The controller 2040 further generates and supplies an impedance control signal 2160 to the impedance matching unit 2030, thereby controlling the output impedance of the amplifier 2020 to be matched with the load impedance for the amplifier 2020.

An input signal 2100 is inputted into the variable-gain amplifier 2010 to be amplified, generating an output signal 2110. The amplified output signal 2110 is then inputted into the linear power amplifier 2020 to be linear-amplified, generating an output signal 2120. The output signal 2120 is further inputted into the impedance matching unit 2030 to be impedance-matched with its load, generating an output signal 2130 of the conventional power amplifier system of FIG. 2.

Similar to the conventional power amplifier system shown in FIG. 1, on maximum output-power operation, the bias for the linear power amplifier 2020 is controlled by the bias control signal 2150 so that the operating point is located at approximately the center of a load line of the amplifier 2020. On low output-power operation, the bias for the linear amplifier 2020 is controlled so that the dc component of the output signal 2120 is decreased.

Further, in the conventional power amplifier system of FIG. 2, the slope of the load line is changed by the use of the impedance control signal 2160 to obtain a wanted output-power level. Thus, the output signal 2120 of the linear amplifier 2020 is always able to have a peak voltage which is approximately equal to a power supply voltage.

As a consequence, the power utilization efficiency on the low output-power operation can be further improved compared with the case of the conventional power amplifier system of FIG. 1.

However, the above conventional power amplifier systems shown in FIGS. 1 and 2 have the following problems.

With the conventional power amplifier system shown in FIG. 1, since the dc component of the output signal 1120 of the linear amplifier 1020 is decreased only by changing the bias for the amplifier 1020, the voltage amplitude of the output signal 1120 decreases with the decreasing input power of the input signal 1100. This causes a problem of low power utilization efficiency.

On the other hand, with the conventional power amplifier system shown in FIG. 2, the load impedance of the linear amplifier 2020 is changed by the use of the impedance matching unit 2030 in addition to the change of the do component of the output signal 2120. Therefore, the voltage amplitude of the output signal 2130 can be prevented from decreasing even if the input power of the input signal 2100 decreases. This means that the above problem of low power utilization efficiency in the conventional system of FIG. 1 does not occur.

However, a problem that the impedance matching unit 2030 is not capable of satisfactory stability in operation and at the same time, the changeable range of the impedance is difficult to be satisfactorily wide.

Specifically, the impedance matching unit 2030 is typically realized by the use of a capacitor element and an inductor element. A varicap, which is difficult to be stably operated for variable power input, is usually employed as the capacitor element, and therefore, the impedance matching unit 2030 is not capable of satisfactory stability in operation.

Also, since the inductance of the inductor element is extremely difficult to be changed, a wanted changeable range of the impedance is realized by only the use of the capacitor element. Therefore, the changeable range of the load impedance is limited to narrow and as a result, it is difficult to be satisfactorily wide.

With the two conventional power amplifier systems shown in FIGS. 1 and 2, the input/output impedance of the power amplifiers 1020 and 2020 varies due to the change of bias and as a consequence, the power transmission efficiency may be degraded.

Further, with the two conventional power amplifier systems shown in FIGS. 1 and 2, since the gain of the power amplifiers 1020 and 2020 is fixed, the variable output of the systems is realized by the use of the variable-gain amplifiers 1010 and 2010. In other words, the variable output of the systems is realized by changing the level of the output signals 1100 and 2110 at the input side of the linear power amplifiers 1020 and 2020 by the variable-gain amplifiers 1010 and 2010.

As a result, the maximum changeable range of the output signal 1120 and 2120 is determined by the maximum and minimum gains of the variable-gain amplifiers 1010 and 2010. Accordingly, the maximum changeable range of the output signals 1120 and 2120 is difficult to be wider.

Additionally, when the output signals 1120 and 2120 are set at an extremely low power level, the gain of the variable-gain amplifiers 1010 and 2010 is reduced to its approximately minimum value. Accordingly, the signal-to-noise ratio (S/N) of the output signal 1120 and 2020 is remarkably degraded.

SUMMARY OF THE INVENTION

Accordingly, an object of the present invention is to provide a power amplifier system which makes it possible to reduce the power consumption at a low power output.

Another object of the present invention is to provide a power amplifier system which makes it possible to stably change the output power within a wide range.

Still another object of the present invention is to provide a power amplifier system which is capable of an improved signal-to-noise ratio even when the output power is extremely low.

A further object of the present invention is to provide a power amplifier system which is able to avoid the degradation of the power transmission efficiency.

The above objects together with others not specifically mentioned will become clear to those skilled in the art from the following description.

A power amplifier system according to a first aspect of the present invention is comprised of a first power amplifier unit having a fixed gain greater than unity, and a second power amplifier unit having a fixed gain greater than unity. The first and second amplifier units are connected in cascade.

The first amplifier unit receives and amplifies an initial input signal and outputs a first output signal. The second amplifier unit receives and amplifies the first output signal and outputs a second output signal.

The power amplifier system according to the first aspect is further comprised of a supply voltage controller and an output selector.

The supply voltage controller serves to control the supply or stop of a power supply voltage to the first and second amplifier units in response to a control signal. The output selector serves to select one of the first and second output signals and to output the selected signal as an output signal of the power amplifier system in response to the control signal.

When a necessary power level of the output signal of the power amplifier system is less than a specific level, only the first amplifier unit is supplied with the power supply voltage under the control of the supply voltage controller, thereby performing its amplification operation. The first output signal is selected to be outputted as the output signal of the system by the output selector.

When a necessary power level of the output signal of the power amplifier system is equal to or greater than the specific level, both of the first and second amplifier units are supplied with the power supply voltage under the control of the supply voltage controller, thereby performing their amplification operations. The second output signal is selected to be outputted as the output signal of the system by the output selector.

With the power amplifier according to the first aspect of the present invention, when a necessary power level of the output signal of the power amplifier system is less than a specific level, only the first amplifier unit is supplied with the power supply voltage under the control of the supply voltage controller, thereby performing its amplification operation. The first output signal is selected to be outputted as the output signal of the system by the output selector.

Thus, the second amplifier unit is not supplied with the power supply voltage at a low power output, and as a result, the power consumption at a low power output can be reduced.

Also, since each of the first and second amplifier units can be independently optimized in bias and load impedance with respect to the maximum power output, the impedance matching unit 2030 as shown in the conventional power amplifier system of FIG. 2 is not necessarily used. Therefore, the output power is able to be stably changed within a specific range.

Because the maximum power output may be increased by adding a further amplifier unit or units to be cascaded with the first or second amplifier unit and/or by increasing the gain of the first and/or second amplifier units, a wide changeable range of the output power can be readily realized.

Unlike the conventional power amplifier systems of FIGS. 1 and 2, the bias of the first and second amplifier units is not changed during operation. Therefore, no degradation of the power transmission efficiency takes place.

For the extremely low output power, if the gain of the first amplifier unit is set at an extremely low value, or the input signal is directly outputted as the output signal of the system without amplification, the signal-to-noise ratio is able to be improved even when the output power is extremely low.

In a preferred embodiment of the first aspect, the initial input signal is directly inputted into the output selector, and the output selector selects one of the initial input signal, and the first and second amplified output signals.

In another preferred embodiment of the first aspect, each of the first and second amplifier units includes a power amplifier circuit whose bias and load (or output) impedance are optimized, an input-impedance matching unit located at a stage prior to the amplifier circuit, and an output-impedance matching unit located at a subsequent stage to the amplifier circuit.

In still another preferred embodiment of the first aspect, a variable-gain amplifier is provided at a prior stage to the first amplifier unit. An additional advantage that the changeable range of the output power is further extended is obtained.

Instead of the variable-gain amplifier, a variable attenuator maybe provided. The variable attenuator may be located at a stage prior to the first amplifier unit or at a stage subsequent to the second amplifier unit.

A power amplifier system according to a second aspect of the present invention is comprised of a first power amplifier unit having a fixed gain greater than unity, and a second power amplifier unit having a fixed gain greater than unity. The first and second amplifier units are connected in cascade.

The first amplifier unit has an amplification mode and a pass-through mode. In the amplification mode, the first amplifier unit receives and amplifies an initial input signal and outputs a first amplified output signal. In the pass-through mode, the first amplifier unit receives and passes the initial input signal through the first amplifier unit and outputs a first non-amplified output signal.

The second amplifier unit has an amplification mode and a pass-through mode. In the amplification mode, the second amplifier unit receives and amplifies the first amplified or non-amplified output signal and outputs a second amplified output signal. In the pass-through mode, the second amplifier unit receives and passes the first amplified or non-amplified output signal through the second amplifier unit and outputs a second non-amplified output signal.

The power amplifier system according to the second aspect is further comprised of a supply voltage controller and an operation-mode selector.

The supply voltage controller serves to control the supply or stop of a power supply voltage to the first and second amplifier units in response to a control signal. The operation-mode selector serves to select one of the amplification mode and the pass-through mode of each of the first and second amplifier units in response to the control signal.

When a necessary power level of the output signal of the power amplifier system is less than a first preset level, none of the first and second amplifier units are supplied with the power supply voltage under the control of the supply voltage controller. The operation-mode selector selects the pass-through mode of the first and second amplifier units. The initial input signal is outputted as the output signal of the system.

When a necessary power level of the output signal of the power amplifier system is equal to or greater than the first preset level and less than a second preset level, one of the first and second amplifier units is selectively supplied with the power supply voltage under the control of the supply voltage controller. The operation-mode selector selects the amplification-mode of a corresponding one of the first and second amplifier units. The first or second amplified output signal is outputted as the output signal of the system.

When a necessary power level of the output signal of the power amplifier system is equal to or greater than the second preset level, both of the first and second amplifier units are supplied with the power supply voltage under the control of the supply voltage controller. The operation-mode selector selects the amplification-mode of the first and second amplifier units. The second amplified output signal is outputted as the output signal of the system.

With the power amplifier according to the second aspect of the present invention, when a necessary power level of the output signal of the power amplifier system is less than a first preset level, none of the first and second amplifier units is supplied with the power supply voltage under the control of the supply voltage controller.

As a result, the power consumption at a low power output can be reduced.

Also, because of the same reason as that of the first embodiment, the output power is able to be stably changed within a specific range, a wide changeable range of the output power can be readily realized, and no degradation of the power transmission efficiency takes place.

For the extremely low output power, the initial input signal is directly outputted as the output signal of the system without amplification and accordingly, the signal-to-noise ratio is able to be improved even when the output power is extremely low.

In a preferred embodiment of the second aspect, each of the first and second amplifier units is comprised of a linear amplifier circuit whose bias and load (or output) impedance are optimized, a first impedance matching unit located at a stage prior to the linear amplifier circuit, a second impedance matching unit located at a subsequent stage to the linear amplifier circuit, a bypassing path having an input end and an output end, and a switch for selecting one of the linear amplifier circuit and the bypassing path.

The first impedance matching unit serves to match the input impedance of the amplifier circuit with the output impedance of a component or circuit at a prior stage to the amplifier circuit. The second impedance matching unit serves to match the output impedance of the amplifier circuit with the input impedance of a component or circuit at a subsequent stage to the amplifier circuit.

In another preferred embodiment of the second aspect, a variable-gain amplifier is provided at a prior stage to the amplifier circuit. An additional advantage that the changeable range of the output power is further extended is obtained.

Instead of the variable-gain amplifier, a variable attenuator may be provided. The variable attenuator may be located at a prior or subsequent stage to the amplifier circuit.

In the power amplifier systems according to the first and second aspects, the number of the amplifier units is optionally determined as necessary.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
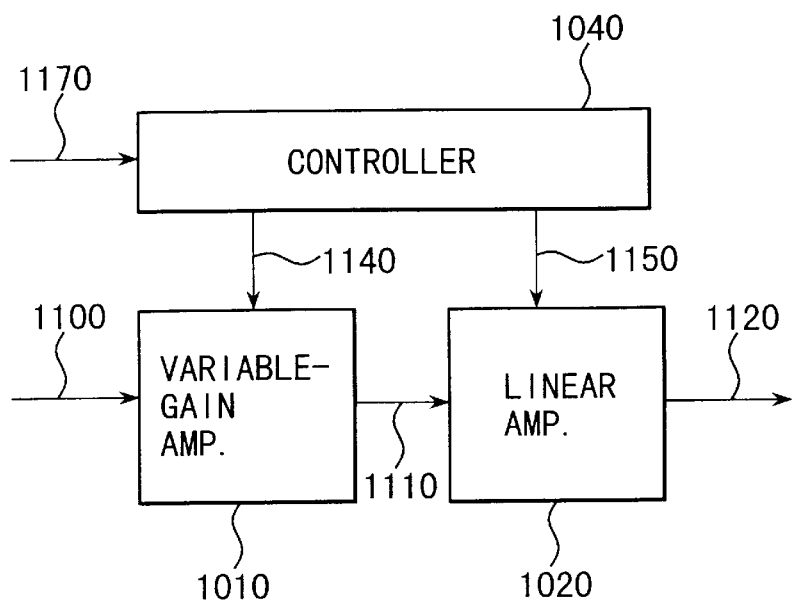
FIG. 1 is a block diagram of a conventional power amplifier system.

Preferred embodiments of the present invention will be described below by referring to the drawings.

FIRST EMBODIMENT

Figure 3:
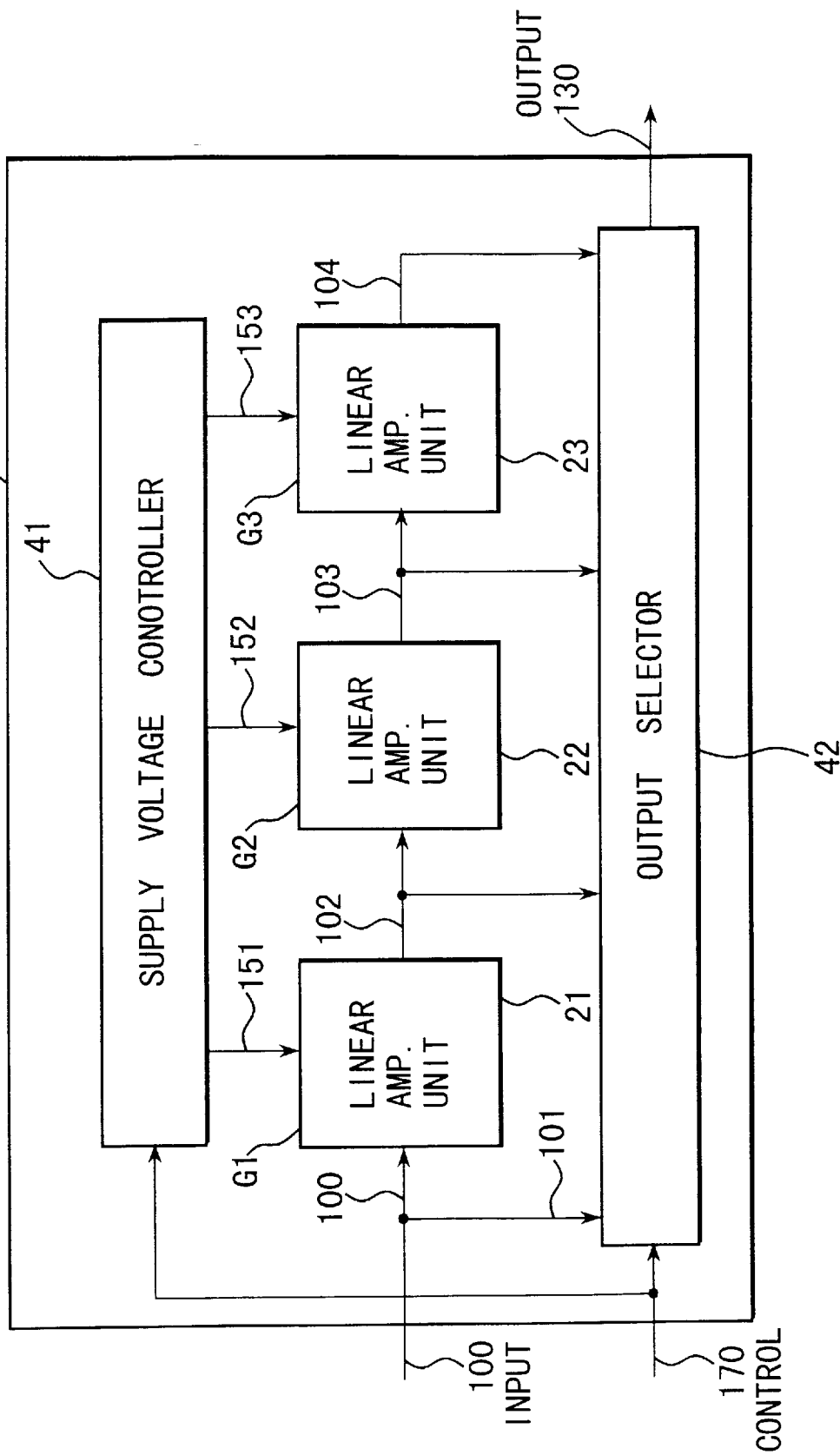
FIG. 3 is a block diagram of a power amplifier system according to a first embodiment of the present invention.

In FIG. 3, a power amplifier system 1 according to a first embodiment of the invention includes first, second and third linear (class-A) amplifier units 21, 22 and 23 which are located a first, second, and third stages, and which are connected in cascade. The amplifier units 21, 22 and 23 have fixed gains G1, G2, and G3, respectively, where G1>1, G2>1, and G3>1.

The power amplifier system 1 further includes a supply voltage controller 41 for controlling the supply or stop of a power supply voltage to the first to third linear amplifier units 21, 22 and 23, and an output selector 42 for selecting a signal to be outputted. The supply voltage controller 41 and the output selector 42 are respectively operated in response to a control signal 170.

An initial input signal 100 to be amplified is inputted into the power amplifier system 1. The initial input signal 100 is first inputted into the first amplifier unit 21. At the same time, the initial input signal 100 is inputted into the output selector 42 as a non-amplified signal 101.

The first amplifier unit 21 amplifies the initial input signal 100 at the gain G1, outputting a first output signal 102. The first output signal 102 is then inputted into the second amplifier unit 22 and the output selector 42. The signal 102 has a gain of G1 with respect to the initial input signal 100.

The second amplifier unit 22 amplifies the first output signal 102 at the gain G2, outputting a second output signal 103. The signal 103 has a total gain of (G1·G2) with respect to the initial input signal 100. The second output signal 103 is then inputted into the third amplifier unit 23 and the output selector 42.

The third amplifier unit 23 amplifies the second output signal 103 at the gain G3, outputting a third output signal 104. The signal 104 has a total gain of (G1·G2·G3) with respect to the initial input signal 100. The third output signal 104 is then inputted into the output selector 42.

The output selector 42 has a function of selecting one of the non-amplified signal 101, and the three amplified signals 102, 103 and 104 and of outputting the selected one as an output signal 130 of the power amplifier system 1 according to the control signal 170.

The supply voltage controller 41 has a function of switching the supply and stop of the power supply voltage to the three amplifier units 21, 22, and 23 according to the control signal 170.

Next, the operation of the power amplifier system 1 according to the first embodiment is described below.

If the output signal 130 is at an extremely low level, the control signal 170 sends an order for stopping the supply voltage to all of the linear amplifier units 21, 22, and 23 to the supply voltage controller 41. In response to this order, the supply voltage controller 41 stops the supply of the supply voltage to the amplifier units 21, 22, and 23.

At the same time, the control signal 170 sends an order for selecting the non-amplified signal 101 to the output selector 42. In response to this order, the output selector 42 selects and output the signal 101 as the output signal 130 of the power amplifier system 1.

In this case, the total gain G of the power amplifier system 1 is unity, i.e., G=1.

If the output signal 130 is at a low level, the control signal 170 sends an order for supplying the supply voltage to only the first linear amplifier unit 21 to the supply voltage controller 41. In response to this order, the supply voltage controller 41 supplies the supply voltage to the first amplifier unit 21. The first amplifier unit 21 outputs the first amplified output signal 102.

At the same time, the control signal 170 sends an order for selecting the amplified output signal 102 to the output selector 42. In response to this order, the output selector 42 selects and outputs the signal 102 as the output signal 130 of the system 1.

In this case, the total gain G of the power amplifier system 1 is G1 greater than unity, i.e., G=G1>1.

If the output signal 130 is at a middle level, the control signal 170 sends an order for supplying the supply voltage to the first and second linear amplifier units 21 and 22 to the supply voltage controller 41. In response to this order, the supply voltage controller 41 supplies the supply voltage to the first and second amplifier units 21 and 22. The first amplifier unit 21 outputs the first amplified output signal 102 and simultaneously, the second amplifier unit 22 outputs the second amplified output signal 103.

At the same time, the control signal 170 sends an order for selecting the second amplified output signal 103 to the output selector 42. In response to this order, the output selector 42 selects and outputs the signal 103 as the output signal 130 of the system 1.

In this case, the total gain G of the power amplifier system 1 is (G1·G2), i.e., G=G1·G2>G1.

If the output signal 130 is at a high level, the control signal 170 sends an order for supplying the supply voltage to all of the first to third linear amplifier units 21, 22 and 23 to the supplyvoltagecontroller41. In response to this order, the supply voltage controller 41 supplies the supply voltage to all of the first to third amplifier units 21, 22 and 23. The first, second, and third amplifier units 21 outputs the output signals 102, 103, and 104, respectively.

At the same time, the control signal 170 sends an order for selecting the third amplified output signal 104 to the output selector 42. In response to this order, the output selector 42 selects and outputs the signal 104 as the output signal 130 of the system 1.

In this case, the total gain G of the power amplifier system 1 is (G1·G2·G3), i.e., G=G1·G2·G3>G·G2

With the power amplifier system 1 according to the first embodiment of FIG. 3, when the required level of the output signal 130 is extremely low, all of the linear amplifier units 21, 22 and 23 are not supplied with the power supply voltage and they do not perform their amplification operations. Therefore, the power consumption is limited to an extremely low level.

Also, if ignoring the signal attenuation due to the signal selection in the output selector 42, the signal-to-noise ratio (S/N) does not degrade, because the input signal 100 itself is outputted as the output signal 130 without amplification.

When the required level of the output signal 130 is high, all of the linear amplifiers 21, 22 and 23 are supplied with the power supply voltage and they perform their amplification operations. The third output signal 104 is selected to be outputted as the output signal 130 of the power amplifier system 1 by the output selector 42.

When the required level of the output signal 130 is in a middle range, only the first linear amplifier unit 21 or the combination of the first and second linear amplifier units 21 and 22 are selectively supplied with the power supply voltage, thereby performing the amplification operation. The first or second amplified output signal 102 or 103 is selectively outputted as the output signal 130 of the system 1 by the output selector 42.

Since one or two of the linear amplifier units 21, 22 and 23 are selectively supplied with the power supply voltage according to the required level of the output signal 130, the power consumption is limited to a level corresponding to the required level of the output signal 130.

Figure 2:
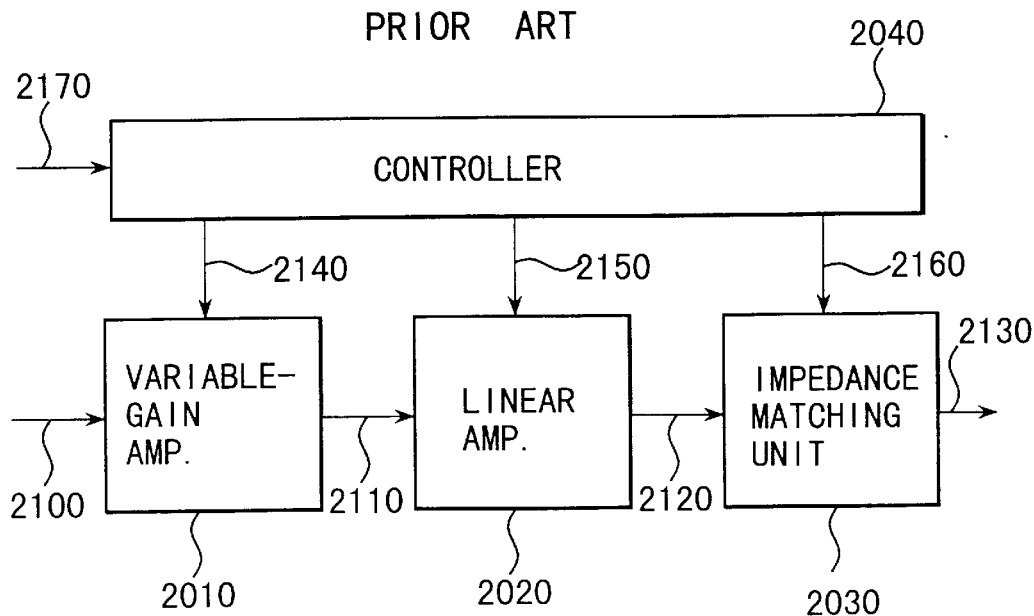
FIG. 2 is a block diagram of another conventional power amplifier system.

Further, unlike the conventional amplifier systems of FIGS. 1 and 2, the bias is not changed during operation and therefore, each of the first to third linear amplifier units 21, 22, and 23 is able to be independently optimized in its bias and load (or output) impedance. As a result, the input/output impedance is able to be matched with the output/input impedance at adjacent stages of each amplifier unit 21, 22, or 23 without the use of a variable impedance matching unit. This means that no degradation of the power transmission efficiency takes place and that the operation of the units 21, 22, and 23 is stable.

Additionally, the three amplifier units 21, 22 and 23 are connected in cascade and the total gain of these units 21, 22, and 23 is changed by selectively activating the units 21, 22 and 23. Accordingly, the output power of the system 1 can be changed within a wide range.

Figure 4:
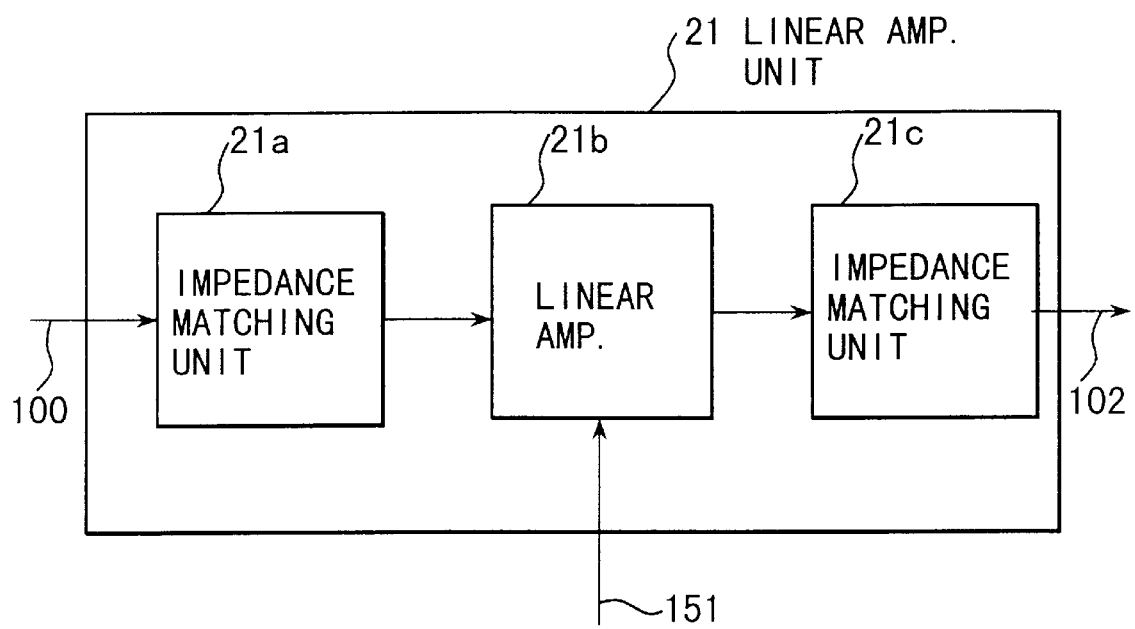
FIG. 4 is a block diagram of the linear amplifier unit used in the power amplifier system according to the first embodiment in FIG. 3.

FIG. 4 shows an example of the first linear amplifier unit 21. The second and third linear amplifier units 22 and 23 have the same configuration as that of the first linear amplifier unit 21 and therefore, the description about the second and third amplifier units 22 and 23 is omitted here for the sake of simplification.

As shown in FIG. 4, the first linear amplifier unit 21 has a linear (class-A) amplifier circuit 21b, an input-impedance matching unit 21a, and an output-impedance matching unit 21c. The amplifier circuit 21b is optimized and fixed in its bias and load (or output) impedance to thereby realize its maximum output power.

The input-impedance matching unit 21a serves to match the input impedance of the amplifier circuit 21b with the output impedance of a component or circuit (not shown) at a prior, adjoining stage to the first linear amplifier unit 21, thereby avoiding the power loss due to impedance mismatching.

The output-impedance matching unit 21c serves to match the output impedance of the amplifier circuit 21b with the input impedance of the second amplifier unit 22 at the next, adjoining stage of the first linear amplifier unit 21, thereby avoiding the power loss due to impedance mismatching.

Any other configuration than that shown in FIG. 4 may be used for the invention.

SECOND EMBODIMENT

Figure 5:
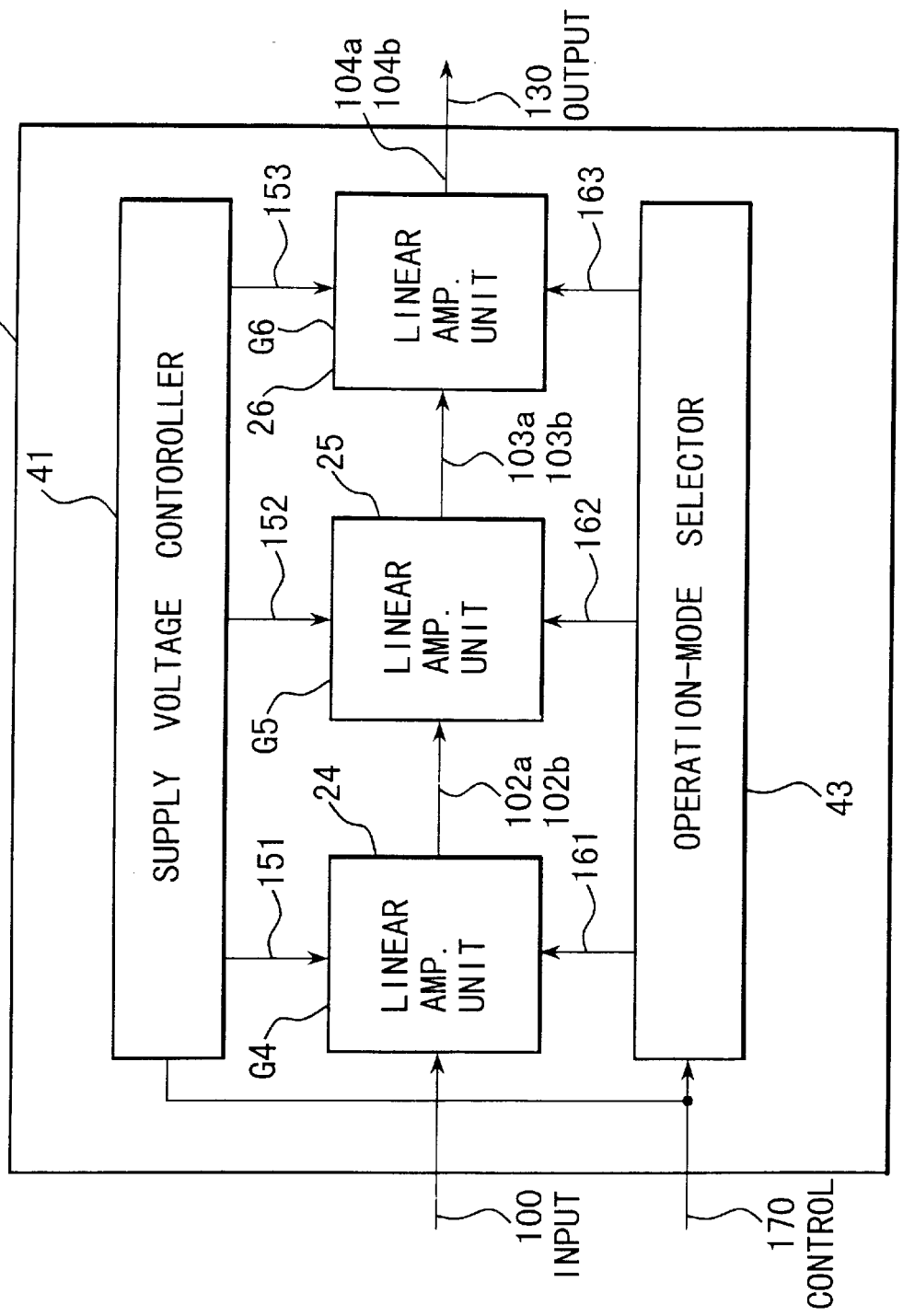
FIG. 5 is a block diagram of a power amplifier system according to a second embodiment of the present invention.

FIG. 5 shows a power amplifier system 2 according to a second embodiment of the invention, which has the same configuration as that of the first embodiment except for two-mode linear amplifiers 24, 25, and 26 and an operation-mode selector 43. Therefore, the description relating to the same configuration is omitted here by adding the same reference characters or numerals to the corresponding elements for the sake of simplification.

As shown in FIG. 5, the power amplifier system 2 includes first, second and third linear (class-A) amplifier units 24, 25 and 26 which are located a first, second, and third stages, respectively. The units 24, 25, and 26 are cascade-connected. The amplifier units 24, 25 and 26 have fixed gains G4, G5, and G6 greater than unity, respectively, i.e., G4>1, G5>1, and G6 >1. Each of the amplifier units 24, 25, and 26 has two operation modes of an amplification mode and a pass-through mode, both modes of which are selectively performed.

The power amplifier system 2 further includes an operation-mode selector 43 for selecting one of the amplification mode and the pass-through mode of the three amplifier units 24, 25, and 26 in response to the control signal 170.

The initial input signal 100 to be amplified is inputted into the power amplifier system 2. The initial input signal 100 is first inputted into the first amplifier unit 24. Unlike the first embodiment, the initial input signal 100 is not inputted into the operation-mode selector 43.

The first amplifier unit 24 amplifies the initial input signal 100 at the gain G4, outputting a first amplified output signal 102a in the amplification mode. The first amplifier unit 24 outputs a first non-amplified output signal 102b without amplification of the initial input signal 100 in the pass-through mode. These two operation modes are alternately performed according to a control signal 161 sent from the operation-mode selector 43. The first amplified or non-amplified output signal 102a or 102b is then inputted into the second amplifier unit 25. None of the output signals 102a and 102b is inputted into the selector 43.

The second amplifier unit 25 amplifies the first amplified or non-amplified output signal 102a or 102b at the gain G5, outputting a second amplified signal 103a in the amplification mode and a second non-amplified signal 103b in the pass-through mode. The second amplified output signal 103a has a total gain of (G4–G5) or G5 with respect to the initial input signal 100. The second non-amplified signal 103b has a total gain of G4 or with respect to the initial input signal 100.

The third amplifier unit 26 amplifies the second amplified or non-amplified output signal 103a or 103b at the gain G6, outputting a third amplified output signal 104a in the amplification mode and a third non-amplified output signal 104b in the pass-through mode. The third amplified output signal 104a has a total gain of (G4·G5·G6), (G4·G6), (G5·G6), or G6 with respect to the initial input signal 100. The second non-amplified signal 103b has a total gain of (G4·G5), G4, G5, or 1 with respect to the initial input signal 100.

The third amplified or non-amplified output signal 104*a* or 104*b* is outputted as the output signal 130 of the power amplifier system 2.

The operation-mode selector 43 has a function of selecting one of the amplification mode and the pass-through mode for each of the first, second, and third amplifier units 24, 25, and 26 in response to the control signal 170.

Figure 6:
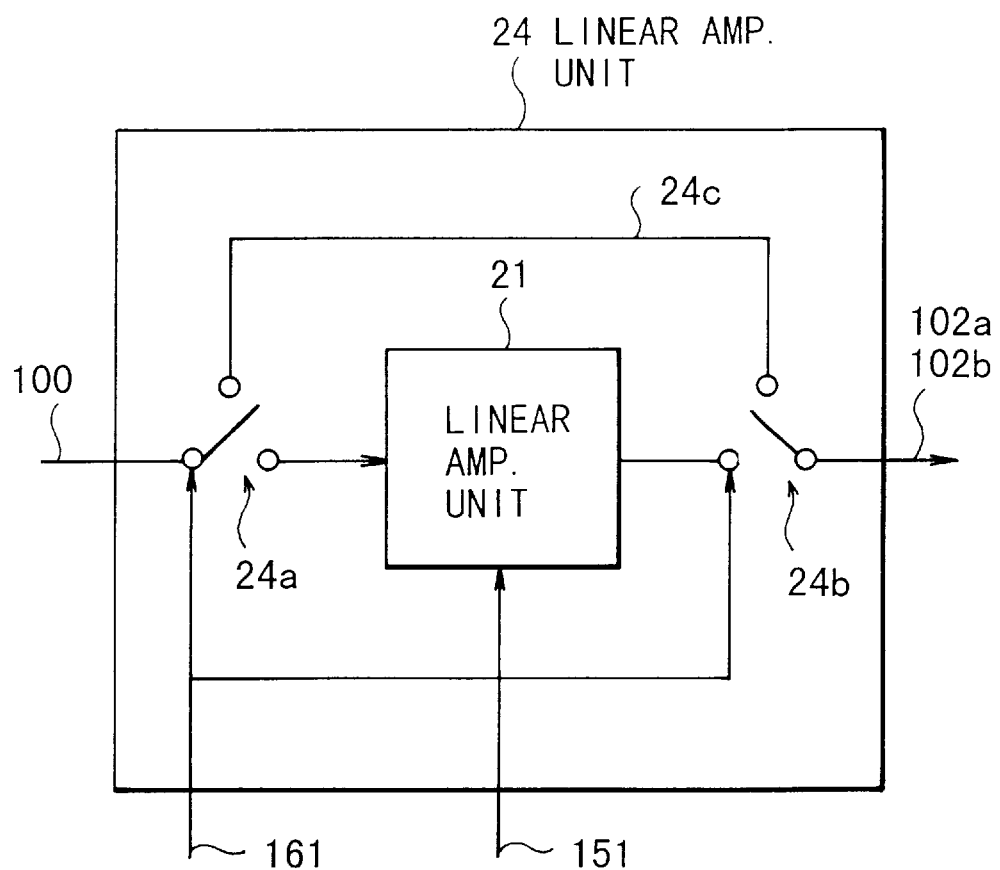
FIG. 6 is a block diagram of the linear amplifier unit used in the power amplifier system according to the second embodiment in FIG. 5.

FIG. 6 shows an example of the first linear amplifier unit 24. The second and third linear amplifier units 25 and 26 have the same configuration as that of the first linear amplifier unit 24. As shown in FIG. 6, the linear amplifier unit 24 has a configuration corresponding to the combination of the linear amplifier unit 21 as shown in FIG. 4 with two switches 24*a* and 24*b*, and a bypassing path 24*c*.

The switches 24*a* and 24*b* are synchronously driven by the control signal 161 sent from the operation-mode selector 43, thereby sending the initial input signal 100 to either the linear amplifier unit 21 or to the bypassing path 24*c*.

When the amplification mode is selected, the linear amplifier unit 21 is selected by the switches 24*a* and 24*b*. The initial input signal 100 is inputted into the unit 21 and is amplified at the gain G4, thereby outputting the first amplified output signal 102*a*. On the other hand, when the pass-through mode is selected, the bypassing path 24*c* is selected by the switches 24*a* and 24*b*. The initial input signal 100 is bypassed through the unit 21, thereby outputting the first non-amplified output signal 102*b* without amplification.

For the second and third linear amplifier units 25 and 26, the same explanation as above is applied.

Next, the operation of the power amplifier system 2 according to the second embodiment is described below.

If the output signal 130 is at an extremely low level, the control signal 170 sends an order for stopping the supply voltage to all of the linear amplifier units 24, 25, and 26 to the supply voltage controller 41. In response to this order, the supply voltage controller 41 stops the supply of the supply voltage to the amplifier units 24, 25, and 26.

At the same time, the control signal 170 sends an order for selecting the pass-through mode with respect to all of the linear amplifiers 24, 25, and 26 to the operation-mode selector 43. In response to this order, the operation-mode selector 43 sends the control signals 161, 162, and 163 to the corresponding linear amplifier units 24, 25, and 26, respectively. As a result, the initial input signal 100 is outputted as the output signal 130 of the power amplifier system 2 through the three linear amplifier units 24, 25, and 26 without amplification.

In this case, the total gain G of the power amplifier 2 is unity, i.e., G=1.

If the output signal 130 is at a low level, the control signal 170 sends an order for supplying the supply voltage to only the first linear amplifier unit 24 to the supply voltage controller 41. In response to this order, the supply voltage controller 41 supplies the supply voltage to the first amplifier unit 24.

At the same time, the control signal 170 sends an order for selecting the amplification mode with respect to the first amplifier unit 24 and the pass-through mode with respect to the second and third linear amplifier units 25 and 26 to the operation-mode selector 43. In response to this order, the selector 43 sends the control signals 161, 162, and 163 to the linear amplifier units 24, 25, and 26, respectively.

As a result, the initial input signal 100 is amplified by the first amplifier unit 24 at the gain G4. The first amplified output signal 102*a*, which is outputted from the first amplifier unit 24, then passes through the second linear amplifier unit 25 without amplification, thereby outputting the second non-amplified output signal 103*b*. The second non-amplified output signal 103*b*, which is outputted from the second amplifier unit 25, then passes through the third linear amplifier unit 26 without amplification, thereby outputting the third non-amplified output signal 104*b*.

In this case, the total gain G of the power amplifier system 2 is equal to G4, i.e., G=G4.

If the output signal 130 is in a middle range, the control signal 170 sends an order for supplying the supply voltage to the first and second linear amplifier units 24 and 25 to the supply voltage controller 41. In response to this order, the supply voltage controller 41 supplies the supply voltage to the first and second amplifier units 24 and 25.

At the same time, the control signal 170 sends an order for selecting the amplification mode with respect to the first and second linear amplifier units 24 and 25 and the pass-through mode with respect to the third linear amplifier unit 26 to the operation-mode selector 43. In response to this order, the selector 43 sends the control signals 161, 162, and 163 to the linear amplifier units 24, 25, and 26, respectively.

As a result, the initial input signal 100 is amplified by the first amplifier unit 24 at the gain G4, outputting the first amplified output signal 102*a*. The first amplified output signal 102*a* is amplified by the second amplifier unit 25 at the gain GS, outputting the second amplified output signal 103*a*. Then, the second amplified output signal 103*a* passes through the third linear amplifier unit 26 without amplification, thereby outputting the third non-amplified output signal 104*b*.

In this case, the total gain G of the power amplifier system 2 is equal to (G4·G5), i.e., G=G4·G5.

If the output signal 130 is in a high level, the control signal 170 sends an order for supplying the supply voltage to the first, second and third linear amplifier units 24, 25, and 26 to the supply voltage controller 41. In response to this order, the supply voltage controller 41 supplies the supply voltage to the first, second, and third amplifier units 24, 25, and 26.

At the same time, the control signal 170 sends an order for selecting the amplification mode with respect to the first, second, and third linear amplifier units 24, 25, and 26. In response to this order, the selector 43 sends the control signals 161, 162, and 163 to the linear amplifier units 24, 25, and 26, respectively.

As a result, the initial input signal 100 is amplified by the first amplifier unit 24 at the gain G4, outputting the first amplified output signal 102*a*. The first amplified output signal 102*a* is amplified by the second amplifier unit 25 at the gain G5, outputting the second amplified output signal 103*a*. The second amplified output signal 103*a* is amplified by the third amplifier unit 26 at the gain G6, thereby outputting the third amplified output signal 104*a*.

In this case, the total gain G of the power amplifier system 2 is equal to (G4·G5·G6), i.e., G=G4·G5·G6.

With the power amplifier according to the second embodiment of FIG. 5, when the required revel of the output signal 130 is extremely low, all of the linear amplifiers 21, 22 and 23 are not supplied with the power supply voltage and they do not perform their amplification operations. Therefore, the power consumption is limited to an extremely low level. This is the same as that of the first embodiment.

Also, if ignoring the signal attenuation due to the signal selection in the amplifier units 24, 25, and 26, the signalto-noise ratio (S/N) does not degrade, because the input signal 100 itself is outputted without amplification as the output signal 130 of the system 2. This also is the same as that of the first embodiment.

When the required level of the output signal 130 is high, all of the linear amplifiers 24, 25 and 26 are supplied with the power supply voltage and they perform their amplification-mode operations. The third amplified output signal 104a is outputted as the output signal 130 of the power amplifier system 2.

When the required level of the output signal 130 is in a middle range, only the first linear amplifier unit 21 or the combination of the first and second linear amplifier units 21 and 22 is/are selectively supplied with the power supply voltage and it/they perform its/their amplification-mode operation or operations. The first amplified output signal 102a or the first amplified output signal 103a is outputted as the output signal 130 of the power amplifier system 2.

Since one or two of the linear amplifier units 24, 25 and 26 are selectively supplied with the power supply voltage according to the required level of the output signal 130, the power consumption is limited to a level corresponding to the required level of the output signal 130.

Further, each of the first to third linear amplifiers 24, 25, and 26 is independently optimized in its bias and load or output impedance and therefore, the input/output impedance is able to be matched with the output/input impedance at adjacent stages of each amplifier unit 21, 22, or 23 without the use of a variable impedance matching unit. This means that no degradation of the power transmission efficiency takes place and that the operation of the units 24, 25, and 26 is stable.

Additionally, the three linear amplifier units 24, 25, and 26 are cascade-connected and the overall gain of these units 24, 25, and 26 is changed by selectively activating the units 24, 25, and 26. Accordingly, the output power of the system 2 can be changed within a wide range.

THIRD EMBODIMENT

Figure 7:
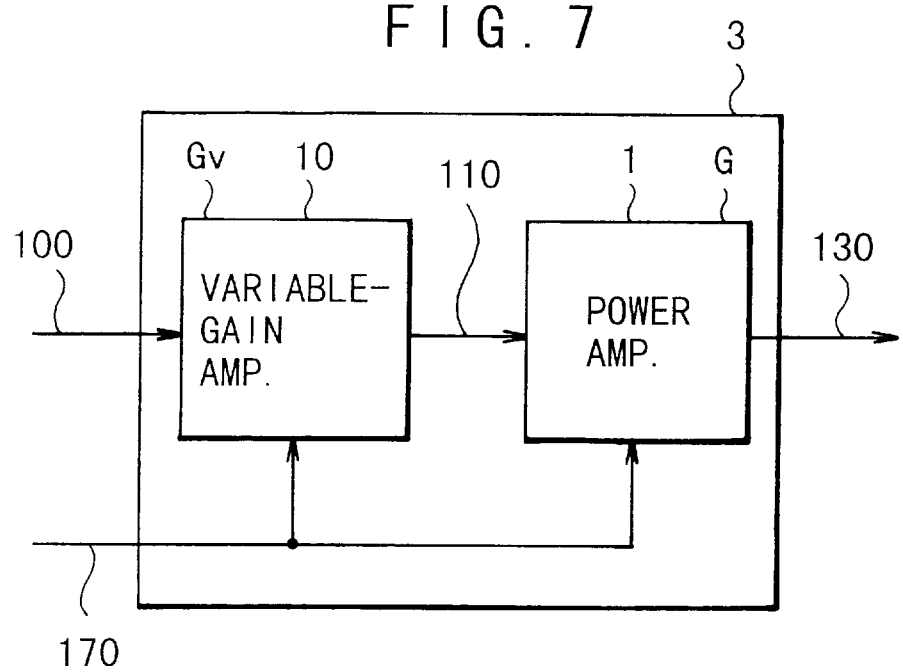
FIG. 7 is a block diagram of a power amplifier system according to a third embodiment of the present invention.

FIG. 7 shows a power amplifier system 3 according to a third embodiment of the invention, which has a configuration corresponding to the combination of the power amplifier system 1 according to the first embodiment with a variable-gain amplifier 10 located at a prior, adjoining stage to the system 1. Therefore, the description relating to the power amplifier system 1 is omitted here by adding the same reference characters or numerals to the corresponding elements for the sake of simplification.

With the power amplifier system 3 according to the third embodiment, an additional advantage that the level of the output signal 130 can be changed at narrower intervals is obtained, because the input level of the system 1 is changed by the amplifier 10.

If the gains G1, G2, and G3 of the linear amplifier units 21, 22, and 23 are designed to be equal to 10 dB, the overall gain of the system 1 varies in steps for every 10 dB, i.e., G=0, 10, 20, and 30 dB. If the variable gain Gv of the variable-gain amplifier 10 is in the range from 0 to 10 dB (or greater), the overall gain G' of the power amplifier system 3 is expressed as (Gv+G). This overall gain G' varies in steps for every narrower value than 10 dB.

FOURTH EMBODIMENT

Figure 8:
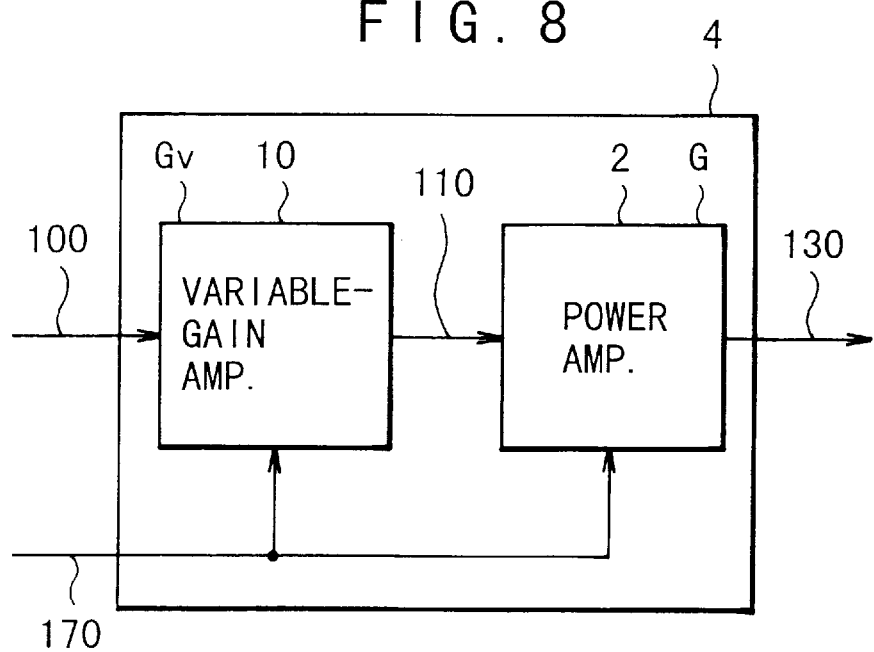
FIG. 8 is a block diagram of a power amplifier system according to a fourth embodiment of the present invention.

FIG. 8 shows a power amplifier system 4 according to a fourth embodiment of the invention, which has a configuration corresponding the combination of the power amplifier system 2 according to the second embodiment and the variable-gain amplifier 10 shown in FIG. 7.

The same additional advantage as that of the third embodiment can be obtained.

FIFTH EMBODIMENT

Figure 9:
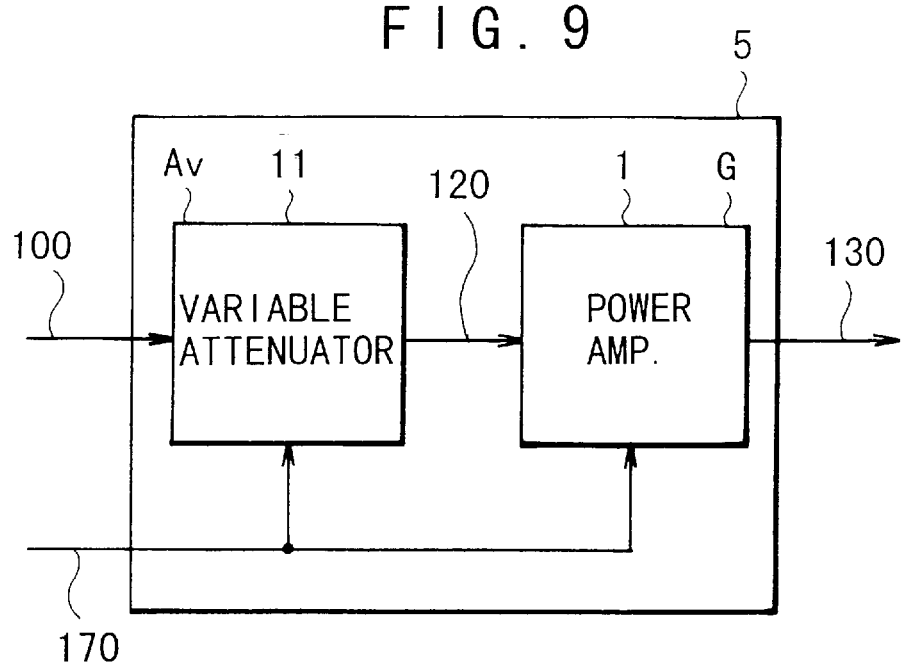
FIG. 9 is a block diagram of a power amplifier system according to a fifth embodiment of the present invention.

FIG. 9 shows a power amplifier system 5 according to a fifth embodiment of the invention, which corresponds to one obtained by replacing the variable-gain amplifier 10 in the third embodiment of FIG. 7 with a variable attenuator 11.

The variable gain Gv of the variable-gain amplifier 10 of FIG. 7 is replaced with the variable attenuation coefficient Av of the attenuator 11. Therefore, the same additional advantage as that of the third embodiment can be obtained.

Additionally, the variable attenuator 11 may be located at a subsequent, adjoining stage to the power amplifier system 1.

SIXTH EMBODIMENT

Figure 10:
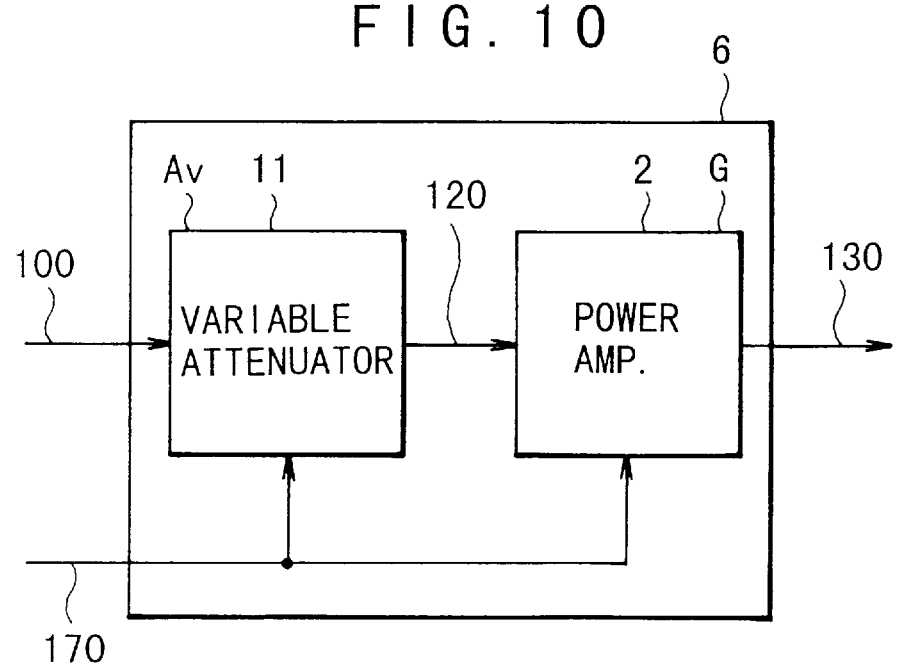
FIG. 10 is a block diagram of a power amplifier system according to a sixth embodiment of the present invention.

FIG. 10 shows a power amplifier 6 according to a sixth embodiment of the invention, which corresponds to one obtained by replacing the variable-gain amplifier 10 in the fourth embodiment of FIG. 8 with a variable attenuator 11.

The same additional advantage as that of the fourth embodiment can be obtained.

The variable attenuator 11 maybe located at a subsequent, adjoining stage to the power amplifier system 2.

In the above embodiments, the three linear amplifier units are provided at three stages. However, it is needless to say that the invention is not limited to this configuration and the number of the linear amplifier units maybe two, four, or more.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A power amplifier system comprising:
   a first power amplifier unit having a fixed gain greater than unity, said first amplifier unit receiving and amplifying an initial input signal and outputting a first output signal;
   a second power amplifier unit having a fixed gain greater than unity, said second amplifier unit receiving and amplifying said first output signal and outputting a second output signal;
   said first and second amplifier units being connected in cascade;
   a supply voltage controller for controlling the supply or stop of a power supply voltage to said first and second amplifier units in response to a control signal; and
   an output selector for selecting one of said initial input signal and said first and second output signals and for outputting said selected signal as an output signal of said power amplifier system in response to said control signal;
   wherein when a necessary power level of said output signal of said power amplifier system is less than a specific level, only said first amplifier unit is supplied with said power supply voltage under the control of said supply voltage controller, thereby performing its amplification operation, and said first output signal is selected to be outputted as said output signal of said system by said output selector;

and wherein when a necessary power level of said output signal of said power amplifier system is equal to or greater than said specific level, both of said first and second amplifier units are supplied with said power supply voltage under the control of said supply voltage controller, thereby performing their amplification operations, and said second output signal is selected to be outputted as said output signal of said system by said output selector.

2. A power amplifier system as claimed in claim 1, wherein each of said first and second amplifier units comprises:

a linear amplifier circuit whose bias and load or output impedance are optimized;

a first impedance matching unit located at a stage prior to said linear amplifier circuit, said first impedance matching unit serving to match the input impedance of said amplifier circuit with the output impedance at a prior stage to said amplifier circuit; and a second impedance matching unit located at a subsequent stage to said linear amplifier circuit, said second impedance matching unit serving to match the output impedance of said amplifier circuit with the input impedance at a subsequent stage to said amplifier circuit.

3. A power amplifier system as claimed in claim 1, further comprising a variable-gain amplifier located at a prior stage to said first power amplifier unit.

4. A power amplifier as system claimed in claim 1, further comprising a variable attenuator located at a prior stage to said first power amplifier unit.

5. A power amplifier system as claimed in claim 1, further comprising a variable attenuator located at a subsequent stage to said second power amplifier unit.

6. A power amplifier comprising:

(a) a first power amplifier unit having a fixed gain greater than unity, said first amplifier unit including an amplification mode and a pass-through mode;

in said amplification mode of said first amplifier unit, said first amplifier unit receiving and amplifying an initial input signal and outputs a first amplified output signal;

in said pass-through mode of said first amplifier unit, said first amplifier unit receiving and passing said initial input signal through said first amplifier unit and outputting a first non-amplified output signal;

(b) a second power amplifier unit having a fixed gain greater than unity, said second amplifier unit including an amplification mode and a pass-through mode;

in said amplification mode of said second amplifier unit, said second amplifier unit receiving and amplifying said first amplified or non-amplified output signal and outputting a second amplified output signal;

in said pass-through mode of said second amplifier unit, said second amplifier unit receiving and passing said first amplified or non-amplified output signal through said second amplifier unit and outputting a second non-amplified output signal;

(c) said first and second amplifier units being connected in cascade;

(d) a supply voltage controller for controlling the supply or stop of a power supply voltage to said first and second amplifier units in response to a control signal; and (e) an operation-mode selector for selecting one of said amplification mode and said pass-through mode of each of said first and second amplifier units in response to said control signal;

(f) wherein when a necessary power level of said output signal of said power amplifier is less than a first preset level, none of said first and second amplifier units are supplied with said power supply voltage under the control of said supply voltage controller, and said operation-mode selector selects said pass-through mode of said first and second amplifier units, and said initial input signal is outputted as said output signal of said system;

(g) and wherein when a necessary power level of said output signal of said power amplifier is equal to or greater than said first preset level and less than a second preset level, one of said first and second amplifier units is selectively supplied with said power supply voltage under the control of said supply voltage controller, and said operation-mode selector selects said amplification-mode of a corresponding one of said first and second amplifier units, and said first or second amplified output signal is outputted as said output signal of said system;

(h) and wherein when a necessary power level of said output signal of said power amplifier is equal to or greater than said second preset level, both of said first and second amplifier units are supplied with said power supply voltage under the control of said supply voltage controller, and said operation-mode selector selects said amplification-mode of said first and second amplifier units, and said second amplified output signal is outputted as said output signal of said system.

7. A power amplifier as claimed in claim 6, wherein each of said first and second amplifier units comprises:

a linear amplifier circuit whose bias and load or output impedance are optimized;

a first impedance matching unit located at a stage prior to said linear amplifier circuit;

a second impedance matching unit located at a subsequent stage to said linear amplifier circuit;

a bypassing path for bypassing said linear amplifier circuit; and a switch for selecting one of said linear amplifier circuit and said bypassing path;

wherein said first impedance matching unit serves to match the input impedance of said amplifier circuit with the output impedance at a prior stage to said amplifier circuit, and said second impedance matching unit serves to match the output impedance of said amplifier circuit with the input impedance at a subsequent stage to said amplifier circuit.

8. A power amplifier as claimed in claim 6, further comprising a variable-gain amplifier located at a prior stage to said first amplifier unit.

9. A power amplifier as claimed in claim 6, further comprising a variable attenuator located at a prior stage to said first amplifier unit.

10. A power amplifier as claimed in claim 6, further comprising a variable attenuator located at a subsequent stage to said second amplifier unit.

11. A power amplifier system comprising:

(a) first to n-th power amplifier units connected in cascade, where n is a natural number greater than unity; each of said first to n-th power amplifier units having a fixed gain greater than unity;

said first amplifier unit receiving and amplifying an initial input signal and outputting a first output signal;

said second to n-th amplifier units receiving and amplifying said first output signal and second to (n-1)-th output signals and outputting second to n-th output signals, respectively;

(b) a supply voltage controller for controlling the supply or stop of a power supply voltage to said first to n-th amplifier units in response to a control signal; and (c) an output selector for selecting one of said initial input signal and said first to n-th output signals and for outputting said selected one as an output signal of said power amplifier system in response to said control signal;

(d) wherein the number of active ones which are selectively supplied with said power supply voltage among said first to n-th amplifier units is changed according to a necessary power level of said output signal of said power amplifier system under the control of said supply voltage controller.

12. A power amplifier system as claimed in claim 10, wherein each of said first to n-th amplifier units comprises:

a linear amplifier circuit whose bias and load or output impedance are optimized;

a first impedance matching unit located at a stage prior to said linear amplifier circuit, said first impedance matching unit serving to match the input impedance of said amplifier circuit with the output impedance at a prior stage to said amplifier circuit; and a second impedance matching unit located at a subsequent stage to said linear amplifier circuit, said second impedance matching unit serving to match the output impedance of said amplifier circuit with the input impedance at a subsequent stage to said amplifier circuit.

13. A power amplifier system as claimed in claim 11, further comprising a variable-gain amplifier located at a prior stage to said first power amplifier unit.

14. A power amplifier system as claimed in claim 11, further comprising a variable attenuator located at a prior stage to said first power amplifier unit.

15. A power amplifier system as claimed in claim 11, further comprising a variable attenuator located at a subsequent stage to said n-th power amplifier unit.

16. A power amplifier comprising:

(a) first to n-th power amplifier units connected in cascade, where n is a natural number greater than unity;

each of said first to n-th power amplifier units having a fixed gain greater than unity;

each of said first to n-th power amplifier units having an amplification mode and a pass-through mode;

in said amplification mode of said first amplifier unit, said first amplifier unit receiving and amplifying an initial input signal and outputs a first amplified output signal;

in said pass-through mode of said first amplifier unit, said first amplifier unit receiving and passing said initial input signal through said first amplifier unit and outputting a first non-amplified output signal;

in said amplification mode of each of said second to n-th amplifier units, said second to n-th amplifier units receiving and amplifying said first to (n-1)-th amplified or non-amplified output signals and outputs a second to n-th amplified output signal, respectively;

in said pass-through mode of each of said second to n-th amplifier unit, said second to n-th amplifier units receiving and passing said first to (n-1)-th amplified or non-amplified output signals through said second to n-th amplifier units and outputting a second to n-th non-amplified output signals, respectively;

(b) a supply voltage controller for controlling the supply or stop of a power supply voltage to said first to n-th amplifier units in response to a control signal; and (c) an operation-mode selector for selecting one of said amplification mode and said pass-through mode of each of said first and second amplifier units in response to said control signal;

(d) wherein the number of active ones which are selectively supplied with said power supply voltage among said first to n-th amplifier units is changed according to a necessary power level of said output signal of said power amplifier system under the control of said supply voltage controller.

17. A power amplifier as claimed in claim 16 wherein each of said first to n-th amplifier units comprises:

a linear amplifier circuit whose bias and load or output impedance are optimized;

a first impedance matching unit located at a stage prior to said linear amplifier circuit;

a second impedance matching unit located at a subsequent stage to said linear amplifier circuit;

a bypassing path for bypassing said linear amplifier circuit; and a switch for selecting one of said linear amplifier circuit and said bypassing path;

wherein said first impedance matching unit serves to match the input impedance of said amplifier circuit with the output impedance at a prior stage to said amplifier circuit, and said second impedance matching unit serves to match the output impedance of said amplifier circuit with the input impedance at a subsequent stage to said amplifier circuit.

18. A power amplifier as claimed in claim 16, further comprising a variable-gain amplifier located at a prior stage to said first amplifier unit.

19. A power amplifier as claimed in claim 16, further comprising a variable attenuator located at a prior to said first amplifier unit.

20. A power amplifier as claimed in claim 16, further comprising a variable attenuator located at a subsequent stage to said second amplifier unit.

* * * * *